United States Patent
Watson

(10) Patent No.: US 6,842,277 B2
(45) Date of Patent: Jan. 11, 2005

(54) DEFORMABLE MIRROR WITH HIGH-BANDWIDTH SERVO FOR RIGID BODY CONTROL

(75) Inventor: Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/448,613

(22) Filed: May 29, 2003

(65) Prior Publication Data

US 2004/0017623 A1 Jan. 29, 2004

Related U.S. Application Data

(60) Provisional application No. 60/398,539, filed on Jul. 23, 2002.

(51) Int. Cl.$^7$ .................. G02B 26/00; G02B 26/08; G02B 7/182; G02B 5/08
(52) U.S. Cl. ............ 359/291; 359/298; 359/198; 359/223; 359/224; 359/822; 359/849; 359/872
(58) Field of Search .................. 359/291, 298, 359/198, 223, 224, 212, 846, 847, 848, 849, 872; 310/309, 26, 90, 328

(56) References Cited

U.S. PATENT DOCUMENTS

| 5,115,351 A | | 5/1992 | Miyawaki et al. ........ 359/849 |
|---|---|---|---|
| 5,406,405 A | * | 4/1995 | Sullivan ................ 359/223 |
| 5,414,565 A | * | 5/1995 | Sullivan et al. .......... 359/872 |
| 6,115,166 A | * | 9/2000 | Kotaki ................ 359/212 |
| 6,155,690 A | * | 12/2000 | Miyahara et al. .......... 359/872 |
| 6,188,502 B1 | * | 2/2001 | Aoki ................ 359/198 |
| 6,411,426 B1 | * | 6/2002 | Meehan et al. .......... 359/291 |
| 6,636,339 B2 | * | 10/2003 | Lee ................ 359/202 |
| 6,735,004 B1 | * | 5/2004 | Hagelin et al. .......... 359/198 |

OTHER PUBLICATIONS

U.S. patent application No. 09/779,944, *Multiple Point Support Assembly For A Stage*, Mike Binnard, et al., filed Feb. 8, 2001, now abandoned.

* cited by examiner

*Primary Examiner*—Loha Ben
(74) *Attorney, Agent, or Firm*—Beyer Weaver & Thomas LLP

(57) ABSTRACT

A deformable mirror arrangement has a plurality of constraint mechanisms contacting a deformable mirror at specified contact positions. At least three of these constraint mechanisms are rigid body servo control mechanisms such as high-bandwidth servo control mechanisms, each including a force actuator contacting the mirror at a corresponding one of the contact positions, a position sensor assisting to measure position of the mirror and a servo control unit for controlling the force actuator.

19 Claims, 4 Drawing Sheets

DEFORMABLE MIRROR WITH HIGH-BANDWIDTH SERVO FOR RIGID BODY CONTROL

"This application claims priority of U.S. provisional application No. 60/398,539 filed on Jul. 23, 2002 which is hereby incorporated by reference."

BACKGROUND OF THE INVENTION

This invention is in the technical field of rigid body control of a deformable mirror and more particularly to rigid body control of a deformable mirror with high-bandwidth servo.

It has been known to support a deformable mirror, and more particularly a thin-membrane mirror, by means of many high-stiffness actuators such as PZT actuators, as described, for example, in U.S. Pat. No. 5,037,184 issued Aug. 6, 1991 to Ealey. These many actuators overconstrain the mirror, and overconstrained mirrors have disadvantages for precision control.

Deformable mirrors with low-stiffness force-type actuators for controlling deformation without overconstraint were disclosed by John Hardy ("Active Optics: A New Technology for the Control of Light," IEEE, Vol. 60, No. 6 (1978)) but high-stiffness kinematic mounts are used for controlling the position in six degrees of freedom. Kinematically constrained deformable mirrors with force actuators require some other means for controlling or adjusting the rigid body position.

SUMMARY OF THE INVENTION

It is therefore an object of this invention to provide a method of precisely controlling the rigid body positions of a deformable mirror.

It is another object of the invention to provide a deformable mirror arrangement for precisely controlling the rigid body positions of a deformable mirror.

It is still another object of this invention to provide a lithography system incorporating an optical system including such a deformable mirror arrangement and a method of precisely controlling the rigid body positions of its deformable mirror.

A deformable mirror arrangement embodying this invention may be characterized as comprising a deformable mirror and a plurality of constraint mechanisms contacting the mirror at specified contact positions, at least three of these constraint mechanisms being rigid body servo control mechanisms such as high-bandwidth servo control mechanisms each including a force actuator contacting the mirror at a corresponding one of the contact positions, a position sensor for detecting the corresponding contact position and a servo control unit for controlling the force actuator. The three rigid body servo control mechanisms may apply parallel constraints on the mirror perpendicularly (along the Z-axis) to the mirror surface to control rigid body degrees of freedom along the Z-axis and around the X- and Y-axes which are perpendicular to the Z-axis. The remaining three of the six rigid body degrees of freedom may be controlled by flexures or other conventional mechanical means.

A control method and a lithography system of this invention are characterized as using a mirror arrangement as described above. The invention also relates to a method of lithography characterized as using a system embodying this invention and products obtained by such a production method.

BRIEF DESCRIPTION OF THE DRAWING

The invention, together with further objects and advantages thereof, may best be understood with reference to the following description taken in conjunction with the accompanying drawings in which.

DETAILED DESCRIPTION OF THE INVENTION

Figure 4:
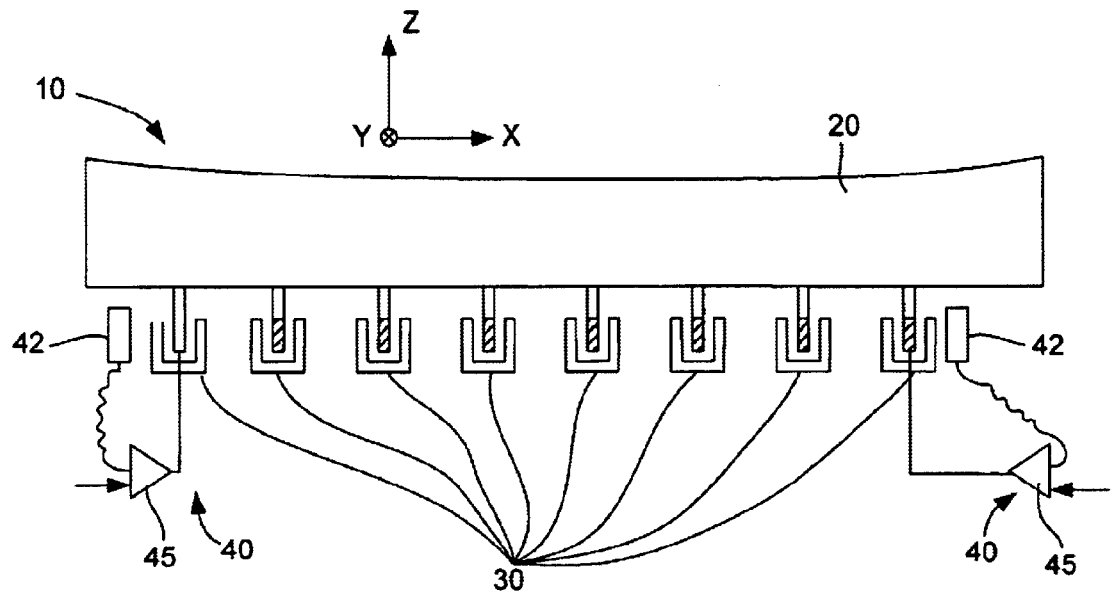
FIG. 4 is a schematic side view of a deformable mirror arrangement.

FIG. 4 shows very schematically a deformable mirror arrangement 10 embodying this invention with a deformable mirror 20 supported by many low-stiffness actuators 30 at as many positions on its back surface for locally deforming the mirror 20. These actuators 30 may be passive or actively controlled. Examples of passive actuators include soft springs of which preload is adjusted with screws or other position actuators. Examples of actively controlled force actuators include voice coil motors (VCMs), pneumatic actuators and EI-core actuators.

Some or all of the six rigid-body degrees of freedom of the mirror 20 are controlled by high-bandwidth servos-controlled actuators. For the convenience of illustration, FIG. 4 shows only two high-bandwidth servos 40 but the mirror arrangement 10 according to this invention include at least three high-bandwidth servos 40 for adjusting at least three rigid body positions. Each of the at least three high-bandwidth servos 40 includes one of the actively controlled force actuators 30, a high-precision sensor 42 and a servo controller 45.

Figure 5:
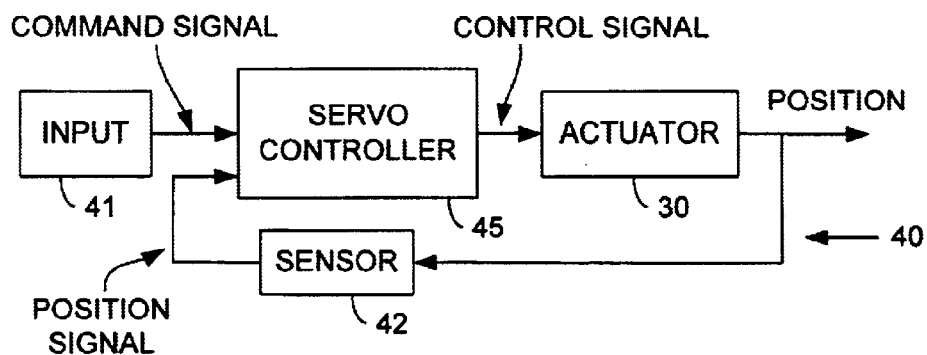
FIG. 5 is a block diagram of a high-bandwidth servo shown in FIG. 4.

As shown in FIG. 5, the servo controller 45 is adapted to receive from an inputting device 41 a command signal indicative of a desired mirror position, or the target position. The sensor 42 measures and outputs a position signal indicative of the present position of the associated actuator 30, that is, the present position of the portion of the mirror 20 contacting the actuator 30. The servo controller 45 compares the command signal with the position signal and outputs a control signal to the actuator 30. The actuator is thereby activated. In the meantime, the sensor 42 continuously monitors the position of the actuator 30 so that the actuator 30 maintains the target position indicated by the command signal.

For the convenience of description, a coordinate system is defined as shown in FIG. 4 with the direction perpendicular to the backside of the mirror 20 designated as the Z-axis. The X-axis and the Y-axis are defined to be perpendicular to each other and both perpendicular to the Z-axis. According to a preferred embodiment of the invention, the aforementioned at least three high-bandwidth servos 40 contact the mirror 20 so as to control its deformation along the Z-axis (piston), around the X-axis (tip) and around the Y-axis (tilt). The remaining three rigid body degrees of freedom around the Z-axis (yaw), along the X-axis and along the Y-axis may be constrained by flexures or other conventional mechanical means. The invention does not prevent these three other rigid body degrees of freedom constrained by similar position servo controls.

Those of the force actuators 30 used in connection with the servos 40 may be the same as, similar to or different from those that are not being used in connection with any of the servos 40 but merely for deforming the mirror 20. Those of the force actuators 30 used in connection with the servos 40 may contact any part of the mirror, not only on the backside but also on the perimeter, as illustrated in FIG. 6.

Figure 6:
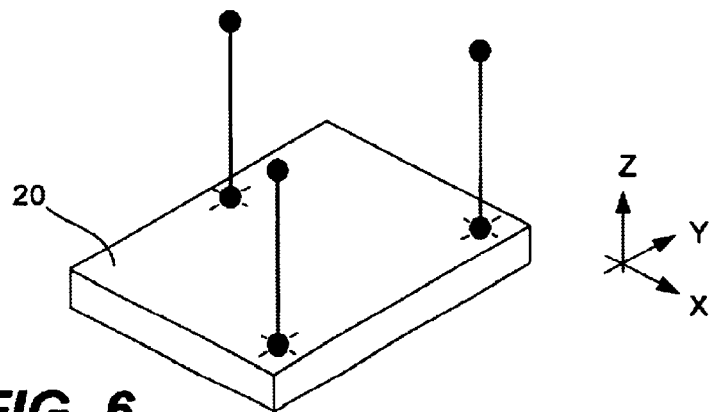
FIG. 6 schematically shows a manner in which rigid body constraints may be applied to a deformable mirror.

FIG. 6 shows an example in which the three servo-controlled actuators 30 apply parallel constraints on the mirror 20 along the Z-axis, the remaining actuators being not shown for clarity. In order to effectively constrain the three rigid body degrees of freedom along the Z-axis, around the X-axis and around the Y-axis, the three parallel constraints must define a triangle of an appreciable size relative to the dimensions of the mirror 20. The remaining three constraints (on the three remaining rigid body degrees of freedom) may be positioned according to a pattern such as shown in FIG. 6.

Throughout herein, the term "mirror" is intended to be interpreted in the broadest sense of the word given in dictionaries such as "a surface able to reflect enough undiffused light to form a virtual image of an object placed before it." Thus, the object of constraint, as described above, need not be limited to a deformable mirror but may be a lens. Basically, the same concepts presented herein are applicable also to a refractive lens although care must be taken in this application such that all contacts and actuators must be outside the clear aperture of the lens so as to allow the light to pass through unobstructed.

Figure 1:
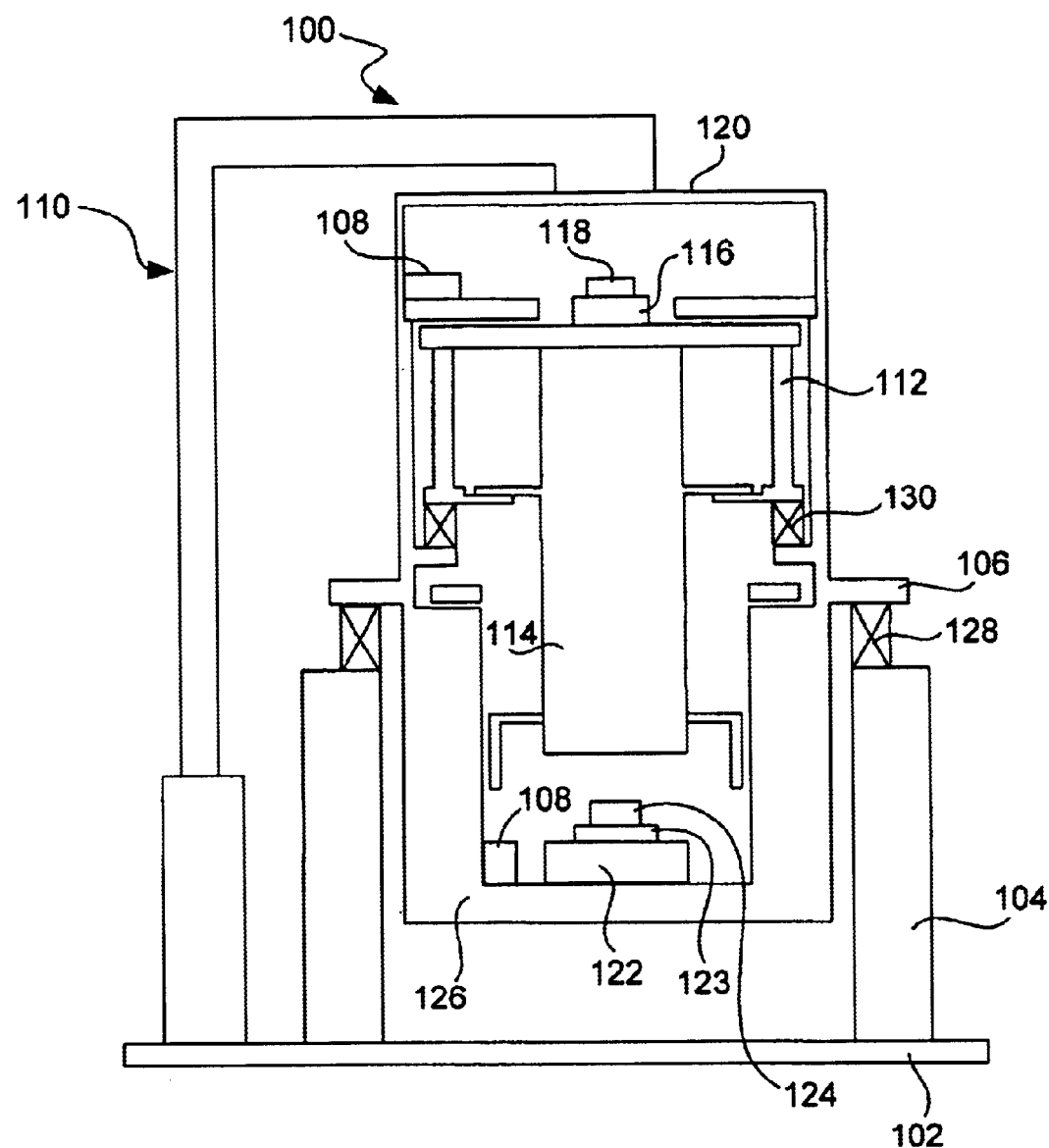
FIG. 1 is a cross-sectional schematic view of a lithographic exposure apparatus incorporating a projection apparatus of this invention.

FIG. 1 shows a typical lithographic exposure apparatus 100 incorporating the deformable mirror of this invention, comprising a mounting base 102, a support frame 104, a base frame 106, a measurement system 108, a control system (not shown), an illumination system 110, an optical frame 112, an optical device 114 which may include the deformable mirror, a reticle stage 116 for retaining a reticle 118, an upper enclosure 120 surrounding the reticle stage 116, a wafer stage 122, a wafer table 123 for retaining a semiconductor wafer workpiece 124, and a lower enclosure 126 surrounding the wafer stage 122.

The support frame 104 typically supports the base frame 106 above the mounting base 102 through a base vibration isolation system 128. The base frame 106 in turn supports, through an optical vibration isolation system 130, the optical frame 112, the measurement system 108, the reticle stage 116, the upper enclosure 120, the optical device 114, the wafer stage 122, the wafer table 123 and the lower enclosure 126 above the base frame 106. The optical frame 112 in turn supports the optical device 114 and the reticle stage 116 above the base frame 106 through the optical vibration isolation system 130. As a result, the optical frame 112, the components supported thereby and the base frame 106 are effectively attached in series through the base vibration isolation system 128 and the optical vibration isolation system 130 to the mounting base 102. The vibration isolation systems 128 and 130 are designed to damp and isolate vibrations between components of the exposure apparatus 100 and comprise a vibration damping device. The measurement system 108 monitors the positions of the stages 116 and 122 relative to a reference such as the optical device 114 and outputs position data to the control system. The optical device 114 typically includes a lens assembly that projects and/or focuses the light or beam from the illumination system 110 that passes through the reticle 118. The reticle stage 116 is attached to one or more movers (not shown) directed by the control system to precisely position the reticle 118 relative to the optical device 114. Similarly, the wafer stage 122 includes one or more movers (not shown) to precisely position the wafer workpiece 124 with the wafer table 123 relative to the optical device (lens assembly) 114.

As will be appreciated by those skilled in the art, there are a number of different types of photolithographic devices. For example, exposure apparatus 100 can be used as a scanning type photolithography system, which exposes the pattern from reticle 118 onto wafer 124 with reticle 118, and wafer 124 moving synchronously. In a scanning type lithographic device, reticle 118 is moved perpendicular to an optical axis of optical device 114 by reticle stage 116 and wafer 124 is moved perpendicular to an optical axis of optical device 114 by wafer stage 122. Scanning of reticle 118 and wafer 124 occurs while reticle 118 and wafer 124 are moving synchronously.

Alternatively, exposure apparatus 100 can be a step-and-repeat type photolithography system that exposes reticle 118 while reticle 118 and wafer 124 are stationary. In the step and repeat process, wafer 124 is in a constant position relative to reticle 118 and optical device 114 during the exposure of an individual field. Subsequently, between consecutive exposure steps, wafer 124 is consecutively moved by wafer stage 122 perpendicular to the optical axis of optical device 114 so that the next field of semiconductor wafer 124 is brought into position relative to optical device 114 and reticle 118 for exposure. Following this process, the images on reticle 118 are sequentially exposed onto the fields of wafer 124 so that the next field of semiconductor wafer 124 is brought into position relative to optical device 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines. The present invention is desirable in machines where it is desirable to prevent the transmission of vibrations.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to optical device 114, when far ultra-violet rays such as the excimer laser is used, glass materials such as quartz and fluorite that transmit far ultra-violet rays is preferably used. When the $F_2$ type laser or x-ray is used, optical device 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 2:
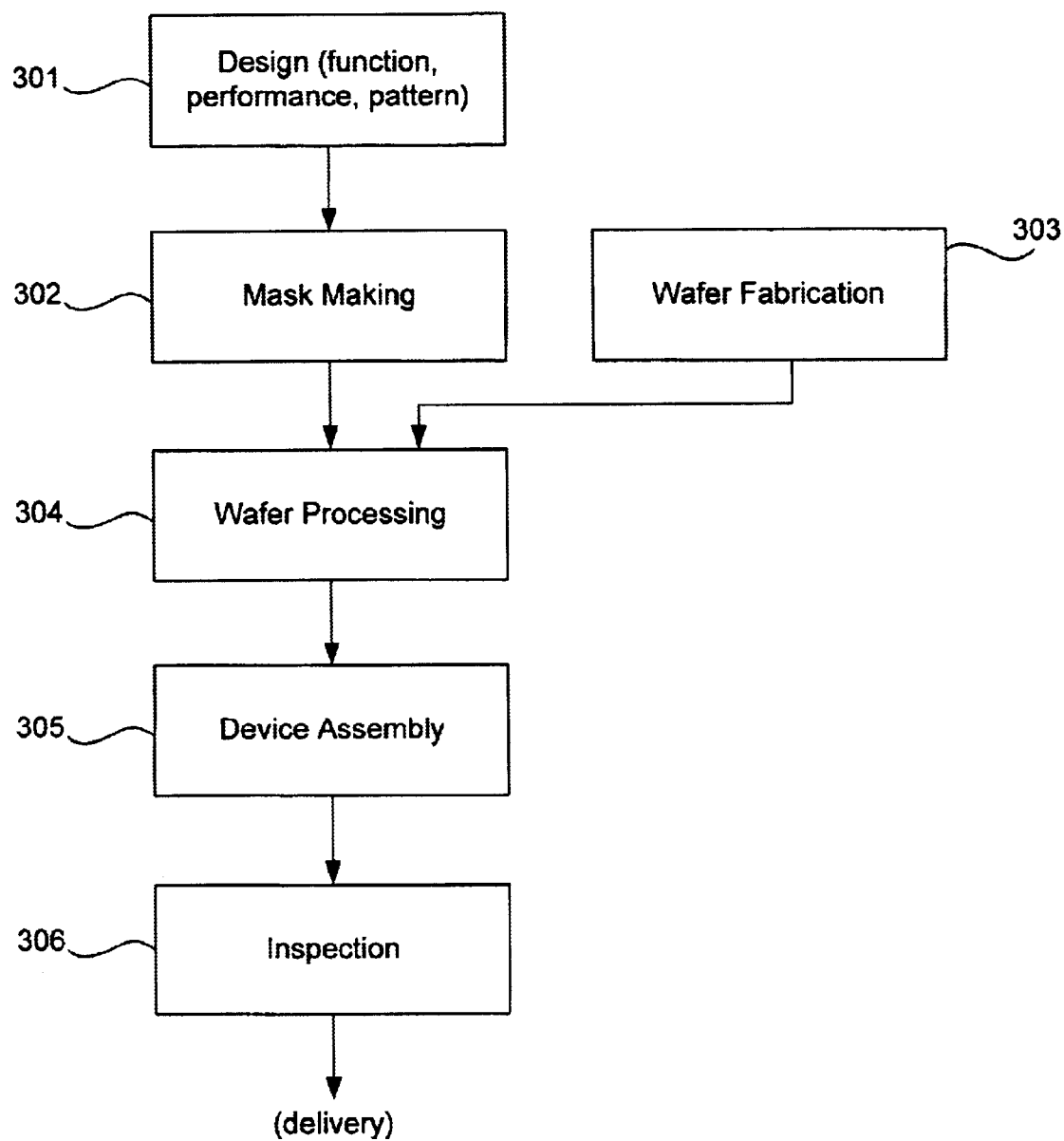
FIG. 2 is a process flow diagram illustrating an exemplary process by which semiconductor devices are fabricated by using the apparatus shown in FIG. 1 according to the present invention.

Further, semiconductor devices can be fabricated using the above described systems, by the process shown generally in FIG. 2. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
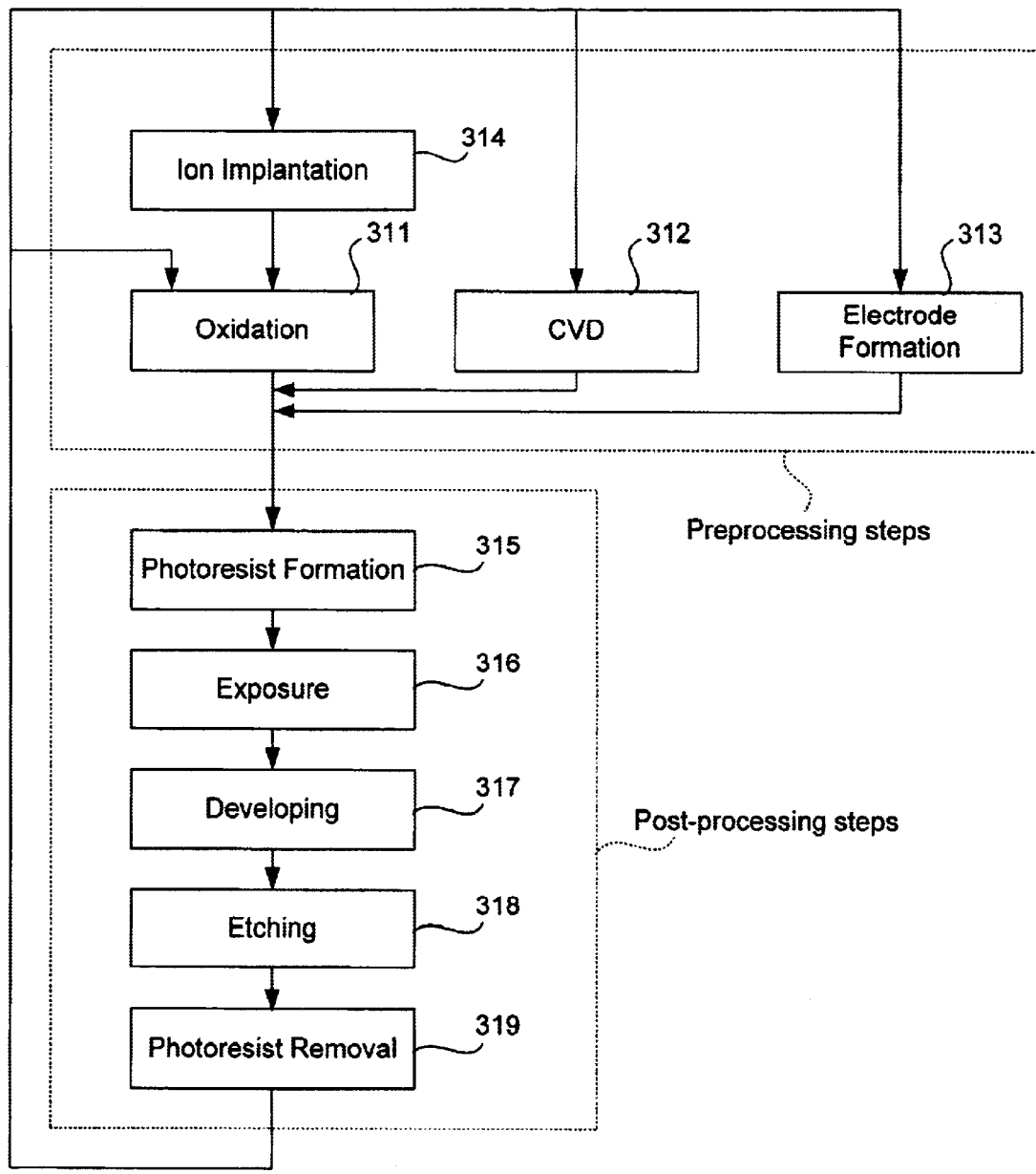
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

While this invention has been described in terms of several preferred embodiments, there are alterations, permutations, and various substitute equivalents which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A deformable mirror arrangement comprising:
   a deformable mirror; and
   a plurality of constraint mechanisms contacting said mirror at specified contact positions, at least three of said constraint mechanisms being rigid body servo control mechanisms each including a force actuator contacting said mirror at a corresponding one of said contact positions, a position sensor assisting to measure position of said mirror and a servo control unit for controlling said force actuator.

2. The deformable mirror arrangement of claim 1 wherein said rigid body servo control mechanisms are high-bandwidth servo control mechanisms.

3. The deformable mirror arrangement of claim 1 wherein said three rigid body servo mechanisms control degrees of freedom of said mirror along a Z-axis, around an X-axis and a Y-axis, said Z-axis being perpendicular to said mirror, said X-axis and said Y-axis being perpendicular to each other and to said Z-axis.

4. The deformable mirror arrangement of claim 3 wherein degrees of freedom of said mirror along said X-axis, along said Y-axis and around said Z-axis are each controlled by a passive mechanical mount.

5. The deformable mirror arrangement of claim 3 wherein degrees of freedom of said mirror along said X-axis, along said Y-axis and around said Z-axis are each controlled by a flexure.

6. The deformable mirror arrangement of claim 3 wherein the three rigid body servo control mechanisms apply parallel constraints on said deformable mirror along said Z-axis.

7. The deformable mirror arrangement of claim 3 wherein each of the three rigid body servo control mechanisms and another corresponding one of said constraint mechanisms apply mutually perpendicular forces at a same position.

8. The deformable mirror arrangement of claim 1 further comprising a plurality of force actuators without servo control for adjusting deformation of said deformable mirror.

9. A method of controlling degrees of freedom of a deformable mirror, said method comprising the steps of:
   providing a plurality of constraint mechanisms contacting said mirror at specified contact positions, at least three of said constraint mechanisms being rigid body servo control mechanisms each including a force actuator contacting said mirror at a corresponding one of said contact positions, a position sensor assisting to measure position of said mirror and a servo control unit for controlling said force actuator; and
   operating said constraint mechanisms to control degrees of freedom of said deformable mirror.

10. The method of claim 9 wherein said rigid body servo control mechanisms are high-bandwidth servo control mechanisms.

11. The method of claim 9 wherein said three rigid body servo mechanisms control degrees of freedom of said mirror along a Z-axis, around an X-axis and a Y-axis, said Z-axis being perpendicular to said mirror, said X-axis and said Y-axis being perpendicular to each other and to said Z-axis.

12. The method of claim 11 wherein degrees of freedom of said mirror along said X-axis, along said Y-axis and around said Z-axis are each controlled by a passive mechanical mount.

13. The method of claim 11 wherein degrees of freedom of said mirror along said X-axis, along said Y-axis and around said Z-axis are each controlled by a flexure.

14. The method of claim 9 further comprising the step of controllingly deforming said mirror by means of a plurality of kinematic mounts without servo control.

15. A lithography system for projecting a pattern on a wafer by a projection beam by preliminarily determining a surface profile of the wafer on a stage and subsequently introducing the stage with the wafer into the projection beam, said lithographic system comprising:
   an illumination source;
   an optical system including a deformable mirror assembly;
   a reticle stage arranged to retain a reticle;
   a working stage arranged to retain a workpiece; and
   an enclosure that surrounds at least a portion of the working stage, the enclosure having a sealing surface;
   wherein said deformable mirror assembly includes a deformable mirror and a plurality of constraint mechanisms contacting said mirror at different contact positions, at least three of said constraint mechanisms being rigid body servo control mechanisms each including a force actuator contacting said mirror at a corresponding one of said contact positions, a position sensor for detecting the corresponding contact position and a servo control unit for controlling said force actuator.

16. An object manufactured with the lithography system of claim 15.

17. A wafer on which an image has been formed by the lithography system of claim 15.

18. A method for making an object using a lithography process, wherein the lithography process utilizes a lithography system as recited in claim 15.

19. A method for patterning a wafer using a lithography process, wherein the lithography process utilizes a lithography system as recited in claim 15.

* * * * *